United States Patent
Sasaki et al.

(10) Patent No.: US 9,261,191 B2
(45) Date of Patent: Feb. 16, 2016

(54) PISTON RING FOR INTERNAL COMBUSTION ENGINE

(71) Applicant: KABUSHIKI KAISHA RIKEN, Chiyoda-ku, Tokyo (JP)

(72) Inventors: Hayato Sasaki, Kumagaya (JP); Takashi Ono, Kumagaya (JP)

(73) Assignee: KABUSHIKI KAISHA RIKEN, Tokyo (JP)

(*) Notice: Subject to any disclaimer, the term of this patent is extended or adjusted under 35 U.S.C. 154(b) by 0 days.

(21) Appl. No.: 14/472,305

(22) Filed: Aug. 28, 2014

(65) Prior Publication Data

US 2015/0061231 A1 Mar. 5, 2015

(30) Foreign Application Priority Data

Aug. 30, 2013 (JP) .................. 2013-180033

(51) Int. Cl.
| | |
|---|---|
| *F16J 9/28* | (2006.01) |
| *F16J 9/12* | (2006.01) |
| *C23C 14/06* | (2006.01) |
| *C23C 16/30* | (2006.01) |
| *C23C 16/32* | (2006.01) |
| *C23C 16/34* | (2006.01) |
| *C23C 16/40* | (2006.01) |
| *C23C 24/08* | (2006.01) |
| *C23C 24/10* | (2006.01) |

(Continued)

(52) U.S. Cl.
CPC .............. *F16J 9/12* (2013.01); *C23C 14/0635* (2013.01); *C23C 14/0641* (2013.01); *C23C 16/303* (2013.01); *C23C 16/325* (2013.01); *C23C 16/345* (2013.01); *C23C 16/402* (2013.01); *C23C 24/08* (2013.01); *C23C 24/10* (2013.01); *C23C 30/00* (2013.01); *F16J 9/26* (2013.01)

(58) Field of Classification Search
CPC .................... F16J 9/00; F16J 9/12; F16J 9/26
USPC .................. 277/436, 440, 442, 443, 444, 456
See application file for complete search history.

(56) References Cited

U.S. PATENT DOCUMENTS

| | | | | |
|---|---|---|---|---|
| 5,297,365 A | * | 3/1994 | Nishioka et al. ................. | 451/41 |
| 2006/0040125 A1 | * | 2/2006 | Obara et al. ................... | 428/556 |

(Continued)

FOREIGN PATENT DOCUMENTS

| | | |
|---|---|---|
| EP | 2119807 A1 | 11/2009 |
| JP | 1216168 A | 8/1989 |

(Continued)

OTHER PUBLICATIONS

Office Action mailed Jul. 29, 2014, corresponds to Japanese patent application No. 2013-180033.

(Continued)

*Primary Examiner* — Gilbert Lee
(74) *Attorney, Agent, or Firm* — Hauptman Ham, LLP

(57) ABSTRACT

An object of the present invention is to provide a piston ring for an internal combustion engine capable of preventing aluminum cohesion for a long time under high temperature and high load conditions. Specifically, a piston ring 1 for the internal combustion engine including a piston ring base material 11 coated with an aluminum cohesion resistant film 12, wherein the aluminum cohesion resistant film 12 is made of ceramics coated on at least one of an upper side face 11a and a lower side face 11b of the piston ring base material 11.

6 Claims, 1 Drawing Sheet

(51) Int. Cl.
    *C23C 30/00*     (2006.01)
    *F16J 9/26*     (2006.01)

(56) References Cited

U.S. PATENT DOCUMENTS

| | | | |
|---|---|---|---|
| 2006/0269790 A1* | 11/2006 | Sarabanda et al. | 428/698 |
| 2008/0247687 A1* | 10/2008 | Stecher | 384/7 |
| 2009/0226756 A1* | 9/2009 | Ogawa et al. | 428/684 |
| 2010/0001474 A1* | 1/2010 | Araujo et al. | 277/443 |
| 2010/0032301 A1* | 2/2010 | Hiratsuka et al. | 205/50 |
| 2011/0148047 A1* | 6/2011 | Araujo | 277/443 |
| 2013/0252860 A1* | 9/2013 | Komori | 508/108 |

FOREIGN PATENT DOCUMENTS

| | | | |
|---|---|---|---|
| JP | 1307568 A | 12/1989 |
| JP | 200314122 A | 1/2003 |
| JP | 2003148242 A | 5/2003 |
| JP | 2003-287129 A | 10/2003 |
| JP | 2007278495 A | 10/2007 |
| JP | 2008248986 A | 10/2008 |
| WO | 2011071049 A1 | 6/2011 |
| WO | 2012/111826 A1 | 8/2012 |

OTHER PUBLICATIONS

Extended European Search Report issued Mar. 6, 2015, corresponding to European patent application No. 14182031.6.

Office Action mailed Oct. 12, 2015, corresponding to European patent application No. 14182031.6.

\* cited by examiner

PISTON RING FOR INTERNAL COMBUSTION ENGINE

RELATED APPLICATIONS

The instant application claims the benefit of Japanese patent application No. 2013-180033 filed Aug. 30, 2013, the entire disclosure of which is incorporated by reference herein.

TECHNICAL FIELD

The present invention relates to a piston ring for an internal combustion engine and, in particular, to a piston ring for an internal combustion engine capable of preventing aluminum cohesion for a long time under high temperature and high load conditions.

BACKGROUND ART

Three piston rings: a top ring, a second ring, and an oil ring those used in an internal combustion engine are disposed in such a manner that each of them engages with a piston ring groove provided on a surface of a piston and serve a gas sealing function of preventing combustion gas from leaking out from a combustion chamber, a heat conduction function of transmitting heat of the piston to a cylinder wall which is cooled down and thereby cooling the piston down, and a function of scooping out excess oil by applying an appropriate amount of engine oil serving as lubrication oil to the cylinder wall, respectively.

Those three piston rings, during operation of the internal combustion engine when the piston is reciprocated by explosion of fuel in the combustion chamber, repeat collision against an inner wall surface of the piston ring groove of the piston ring. Also, the piston rings are slidable inside the piston ring groove in a circumferential direction thereof and slide inside the piston ring. However, the piston ring groove has projections having a height of approximately 1 μm on a surface thereof generated by machine turning in forming the groove. Therefore, the projections wear due to the sliding collision of the piston ring, causing exposure of an aluminum surface on the surface of the piston ring groove.

When the exposed aluminum surface comes into contact with a piston ring side face by the collision and the piston ring further repeats the sliding, aluminum cohesion, a phenomenon that aluminum alloy is adhered to the piston ring side face, occurs. This phenomenon is especially noticeable at the top ring located proximate to the combustion chamber and exposed to high temperature.

When the aluminum cohesion further progresses, wear of the piston groove rapidly progresses and the piston ring becomes fixed to the ring groove. As a result, the gas sealing function of the piston ring is degraded and causes a phenomenon what is called blow-by that high pressure combustion gas flows out to a crank chamber from the combustion chamber, leading a reduction in engine power.

As such, there have been suggested a variety of techniques for preventing the aluminum cohesion of the piston ring. PTL 1, for example, describes a technique for preventing the aluminum cohesion by providing a resin-based film containing carbon black particles on the side face of the piston ring that slides and collides against the piston ring groove, thereby improving conformability.

Also, PTL 2 describes a technique for effectively preventing the piston ring from the aluminum cohesion by providing a heat-resistant resin containing, relative to an entire surface film, 10 to 80 mass % of one or more powder selected from a group including nickel-based powder, lead-based powder, zinc-based powder, tin-based powder, and silicon-based powder to at least one of an upper side face and a lower side face of the piston ring.

However, the films described in PTLs 1 and 2 have a problem that, when temperature inside an engine rises, aluminum cohesion resistance is degraded. As such, PTL 3 describes a technique that provides a polyimide film containing hard particles and having a solid lubricant function to at least one of the upper side face and the lower side face of the piston ring, thereby maintaining high aluminum cohesion resistance for a long time under high temperature conditions over 230° C.

Further, PTL 4 describes a technique that provides, instead of the resin-based film, a first diamond like carbon (DLC) film containing at least silicon and a second DLC film formed under the first DLC film and containing at least W, or W and Ni, to the upper side face and the lower side face of the piston ring, thereby providing a piston ring having excellent aluminum cohesion resistance, scuff resistance and abrasion resistance.

CITATION LIST

Patent Literature

PTL 1: JP 2007-278495 A
PTL 2: JP 2008-248986 A
PTL 3: WO2011/071049
PTL 4: JP 2003-014122 A

SUMMARY OF INVENTION

Technical Problem

In recent years, incidentally, downsizing of motor vehicles has been proceeding and an amount of exhaust gas has been reduced in order to improve fuel efficiency. As a result, temperature and pressure inside the engine have been increasingly rising. However, the resin-based film as described in PTL 3, under conditions with high temperature over 260° C. and a high load of an internal pressure of the engine in excess of 10 MPa, has difficulty in maintaining the aluminum cohesion resistance for a long time.

Also, the DLC film described in PTL 4, due to the graphitization of diamond under high temperature conditions over 260° C., has difficulty in exerting inherent characteristics thereof and maintaining the aluminum cohesion resistance.

Therefore, a piston ring capable of maintaining the aluminum cohesion resistance for a long time under conditions with high temperature over 260° C. and a high load of the internal pressure of the engine in excess of 10 MPa has been desired.

As such, an object of the present invention is to provide a piston ring for the internal combustion engine capable of preventing the aluminum cohesion for a long time under the high temperature and high load conditions.

Solution to Problem

The inventors diligently researched a method to solve the above problem. As a result, the inventors found that it is effective to coat a surface of a piston ring material with an aluminum cohesion resistant film made of ceramics having high durability under high temperature conditions over 260° C., and thus accomplished the present invention.

That is, a summary and constitution of the present invention is as follows.

(1) A piston ring for an internal combustion engine including a piston ring base material coated with an aluminum cohesion resistant film, wherein the aluminum cohesion resistant film is made of ceramics coated on at least one of an upper side face or a lower side face of the piston ring base material.

(2) The piston ring for the internal combustion engine according to the foregoing (1), wherein Vickers hardness HV of the aluminum cohesion resistant film and an arithmetic average roughness Ra (μm) of a surface of the aluminum cohesion resistant film satisfy the following formula (A):

Note $$Ra < -8.7 \times 10^{-5} HV + 0.39 \quad \text{(A)}.$$

(3) The piston ring for the internal combustion engine according to the foregoing (1), wherein the Vickers hardness HV of the aluminum cohesion resistant film and a thickness h (μm) of the aluminum cohesion resistant film satisfy the following formula (B):

Note $$h > -2.9 \times 10^{-4} HV + 0.89 \quad \text{(B)}.$$

(4) The piston ring for the internal combustion engine according to the foregoing (1), wherein the Vickers hardness HV of the aluminum cohesion resistant film is 500 to 2800.

(5) The piston ring for the internal combustion engine according to the foregoing (1), wherein the arithmetic average roughness Ra (μm) of the surface of the aluminum cohesion resistant film is no more than 0.3 μm.

(6) The piston ring for the internal combustion engine according to the foregoing (1), wherein the thickness h (μm) of the aluminum cohesion resistant film is 0.1 μm to 20 μm.

(7) The piston ring for the internal combustion engine according to the foregoing (1), wherein the ceramics forming the aluminum adhesion resistant film is composed of at least one selected from a group including alumina, titania, yttria, zirconia, silica, magnesia, chromia, silicon carbide, chromium carbide, aluminum nitride, titanium nitride, silicon nitride, and chromium nitride.

Advantageous Effect of Invention

According to the present invention, since at least one of the upper side face and the lower side face of the piston ring base material is coated with the aluminum cohesion resistant film made of ceramics, aluminum cohesion may be prevented for a long time under high temperature and high load conditions.

DESCRIPTION OF EMBODIMENT

Figure 1:
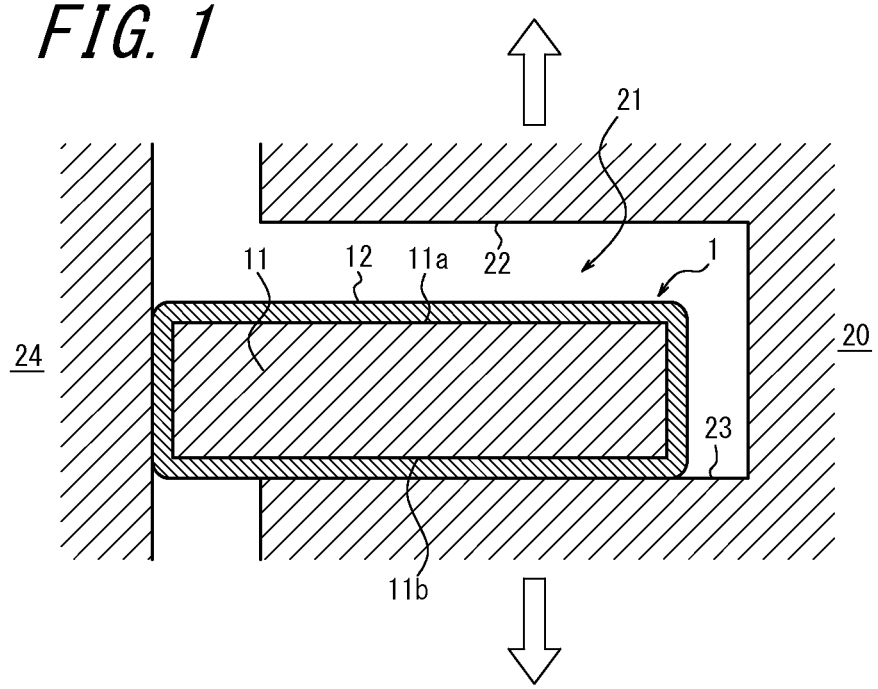
FIG. 1 is a schematic cross-sectional view of a piston ring for an internal combustion engine according to the present invention in a state engaging with a piston ring groove.

Hereinafter, an embodiment of the present invention will be described with reference to the accompanying drawings. FIG. 1 is a schematic cross-sectional view of a piston ring for an internal combustion engine according to the present invention in a state engaging with a piston ring groove. A piston ring 1 for the internal combustion engine illustrated in the figure is a piston ring for the internal combustion engine including a piston ring base material 11 coated with an aluminum cohesion resistant film 12. Here, it is essential that the aluminum cohesion resistant film 12 be made of ceramics coated on at least one of an upper side face 11a and a lower side face 11b of the piston ring base material 11.

As illustrated in FIG. 1, the piston ring 1 engages with a piston ring groove 21 inside therewith and closes a gap between a side wall of a cylinder 24 and a piston 20, thereby sealing combustion gas and oil in. The piston ring 1, following a reciprocating motion of a piston 5 (a motion indicated by arrows in the figure), moves upward and downward inside the piston ring groove 21, repetitively colliding against an upper face 22 and a lower face 23 of the piston ring groove 21. Also, since the piston ring 1 is slidable in a circumferential direction inside the piston ring groove 21, the piston ring 1 repeatedly slides colliding against the upper face 22 and the lower face 23 of the piston ring groove 21.

Since the piston ring 1 repeatedly slides and collides against the upper face 22 and the lower face 23 of the piston ring groove 21, projections (not shown) formed on the upper face 22 and the lower face 23 of the piston ring groove 21 are scraped off, exposing an aluminum surface around projection marks. According to the present invention, here, since the aluminum cohesion resistant film 12 is made of ceramics having high durability under high temperature conditions, a conformable surface where the aluminum surface is scraped off and primary crystal silicon protrudes from the surface is formed between the upper face 22 and the lower face 23 of the piston ring groove 21 and thus the aluminum cohesion may be prevented. The following is a description of requirements for the piston ring 1.

A material of the piston ring base material 11 is not particularly limited as long as it has the strength to withstand an impact with the piston ring groove 21. The material is preferably steel, martensitic stainless steel, austenitic stainless steel, high-grade cast iron, or the like. Also, in order to improve wear resistance, the base material may have a side face having been subjected to nitriding treatment when the base material is made of stainless steel, or a side face plated with hard Cr or electroless nickel when the base material is made of cast iron.

The ceramics forming the aluminum cohesion resistant film 12 may be at least one selected from a group including alumina, titania, yttria, zirconia, silica, magnesia, chromia, silicon carbide, chromium carbide, aluminum nitride, titanium nitride, silicon nitride, and chromium nitride. In particular, from the viewpoint of that Vickers hardness HV of the primary crystal silicon of a surface layer of the conformable surface formed on the surface of the piston ring groove 21 is approximately 1000 and also from the viewpoint of compatibility with a material of the piston, the ceramics is preferably at least one selected from a group including titania, yttria, zirconia, silica, magnesia, chromia, aluminum nitride, and silicon nitride.

Also, the Vickers hardness HV of the aluminum cohesion resistant film 12 is preferably 500 to 2800. Here, when the Vickers hardness HV is no less than 500, the aluminum cohesion resistant film 12 may secure sufficient hardness, thereby suppressing significant wear of the aluminum cohesion resistant film 12 caused by the primary crystal silicon (having the Vickers hardness HV of approximately 1000) of the surface layer of the conformable surface formed on the surface of the piston ring grove 21. Also, when the Vickers hardness HV is no more than 2800, destruction of the primary crystal silicon of the surface layer of the conformable surface may be suppressed, thereby preventing significant wear of a piston material.

Surface roughness of the aluminum cohesion resistant film 12 is preferably no more than 0.3 μm. The aluminum cohesion resistant film 12 made of ceramics having such surface roughness, when coming into contact with the piston ring groove, may reduce a surface pressure and decrease damage to the piston material, thereby suppressing an increase in a wear amount of the piston material. Note that, according to the present invention, the surface roughness of the ceramics is represented by arithmetic average roughness Ra in conformity with JIS B0601(1994) and measured by means of a surface roughness measurement apparatus.

Here, the Vickers hardness HV of the aluminum cohesion resistant film 12 and the arithmetic average roughness Ra of the surface preferably satisfy the following formula (A):

$$Ra < -8.7 \times 10^{-5} HV + 0.39 \quad\quad (A).$$

The inventors formed the aluminum cohesion resistant film 12 made of various materials and having various Vickers hardness HV, surface roughness, and coating thickness on the piston ring base material 11 and evaluated the aluminum cohesion resistant property of the piston ring 1 thus obtained and the wear amount of the piston material. As a result, the inventors have found that, when the Vickers hardness HV of the aluminum cohesion resistant film 12 and the arithmetic average roughness Ra of the surface satisfy the above formula (A), wear of the piston material is suppressed while high aluminum cohesion resistant property is achieved. It is believed that, since the arithmetic average roughness Ra of the surface is at a value appropriate for the hardness of the aluminum cohesion resistant film 12, the surface pressure between the piston ring 1 and the upper face 22 and the lower face 23 of the piston ring groove 21 may be reduced.

Further, the thickness of the aluminum cohesion resistant film 12 is preferably 0.1 μm to 20 μm. When the thickness is within this range; here, no less than 0.1 μm, since the aluminum cohesion resistant film 12 has a sufficient thickness relative to the surface roughness of the ceramics and becomes homogeneous, the aluminum cohesion resistant film 12 may reduce the wear amount of the piston material. Also, when the thickness is no more than 20 μm, sufficient clearance inside the piston ring groove 21 may be secured, allowing performance of the piston ring described above.

Here, the Vickers hardness HV and coating thickness h (μm) of the aluminum cohesion resistant film 12 preferably satisfy the following formula (B):

$$h > -2.9 \times 10^{-4} HV + 0.89 \quad\quad (B).$$

The inventors have found that, similarly to the aforementioned formula (A), also when the Vickers hardness HV of the aluminum cohesion resistant film 12 and the coating thickness satisfy the foregoing formula (B), the wear of the piston material is suppressed while high aluminum cohesion resistant property is achieved. It is believed that, since the coating thickness h is at a value appropriate for the hardness of the aluminum cohesion resistant film 12, the wear of the piston material may be suppressed without wearing the aluminum cohesion resistant film 12.

Such an aluminum cohesion resistant film 12 as described above may be formed by various known methods. In particular, under appropriate film forming conditions by employing a thermal spraying method, Chemical Vapor Deposition (CVD) method, a Physical Vapor Deposition (PVD) method, an aerosol deposition method, a cold spray method, a sol-gel method or the like, the piston ring of the present invention may be produced.

Therefore, the piston ring according to the present invention may prevent the aluminum cohesion for a long time under high temperature and high load conditions.

EXAMPLES

Production of Piston Ring

The following is a description of examples of the present invention.

On both upper and lower side faces of the piston ring base material made of low chromium steel, films made of materials and having the Vickers hardness, the surface roughness, and the thickness as shown in Tables 1 to 3 were formed. Here, films of Examples 4, 7, 11, 13, 21 to 23, and 29 to 34 were formed by employing the aerosol deposition method, and films of Examples 8, 12, and 14 to 17 were formed by employing the thermal spraying method. Also, films of Examples 1, 6, 9, 10, 18 to 20, and 24 to 28 were formed by employing the CVD method, and films of Examples 2, 3, and 5 were formed by employing the PVD method, and thus the piston ring was produced.

On the other hand, films of Comparative examples 1 and 2 were formed by employing the spray coating of paint prepared with compositions described below, and thus the piston ring was produced.

A film of Comparative example 3 was formed by employing an electroless plating method, and thus the piston ring was produced.

A film of Comparative example 4 was formed by employing the PVD method, and thus the piston ring was produced.

As shown in Table 1, the aluminum cohesion resistant films of Examples 14 to 17 are made from two types of ceramics; a blend of $Al_2O_3$ and $SiO_2$ at a rate of 3:2 in Example 14, a blend of MgO and $SiO_2$ at a rate of 2:1 in Example 15, $Al_2O_3$ containing 3 mass % of $TiO_2$ added thereto in Example 16, and $Al_2O_3$ containing 40 mass % of $TiO_2$ added thereto in Example 17.

Note that a resin film A of Comparative example 1 is a polyimide resin film containing 5 mass % of $MoS_2$ powder (an average particle size of 2 μm) and 5 mass % of graphite powder (the average particle size of 2 μm).

Further, a resin film C of Comparative example 2 is a polyimide resin film containing 10 mass % of $Al_2O_3$ powder (the average particle size of 0.5 μm).

TABLE 1

| | | Film | | | Result of engine simulation test | | | |
| | | | | | Piston ring | | Piston | |
| | Material | Vickers hardness (HV) | Surface roughness Ra (μm) | Coating thickness (μm) | Film remaining amount | Aluminum cohesion resistant property | material Wear amount | Decision |
|---|---|---|---|---|---|---|---|---|
| Example 1 | SiC | 2800 | 0.05 | 1 | E | E | E | E |
| Example 2 | TiN | 2200 | 0.05 | 1 | E | E | E | E |
| Example 3 | CrN | 2000 | 0.05 | 1 | E | E | E | E |

TABLE 1-continued

|  | Film | | | | Result of engine simulation test | | | |
|---|---|---|---|---|---|---|---|---|
|  |  |  |  |  | Piston ring | | Piston | |
|  | Material | Vickers hardness (HV) | Surface roughness Ra (μm) | Coating thickness (μm) | Film remaining amount | Aluminum cohesion resistant property | material Wear amount | Decision |
| Example 4 | Al$_2$O$_3$ | 1700 | 0.05 | 1 | E | E | E | E |
| Example 5 | CrC | 1600 | 0.05 | 1 | E | E | E | E |
| Example 6 | Si$_3$N$_4$ | 1500 | 0.05 | 1 | E | E | E | E |
| Example 7 | ZrO$_2$ | 1400 | 0.05 | 1 | E | E | E | E |
| Example 8 | Cr$_2$O$_3$ | 1300 | 0.05 | 1 | E | E | E | E |
| Example 9 | SiO$_2$ | 1000 | 0.05 | 1 | E | E | E | E |
| Example 10 | AlN | 1000 | 0.05 | 1 | E | E | E | E |
| Example 11 | Y$_2$O$_3$ | 700 | 0.05 | 1 | E | E | E | E |
| Example 12 | MgO | 700 | 0.05 | 1 | E | E | E | E |
| Example 13 | TiO$_2$ | 500 | 0.05 | 1 | G | E | E | E |
| Example 14 | 3Al$_2$O$_3$—2SiO$_2$ | 1200 | 0.05 | 1 | E | E | E | E |
| Example 15 | 2MgO—SiO$_2$ | 800 | 0.05 | 1 | E | E | E | E |
| Example 16 | Al$_2$O$_3$—3%TiO$_2$ | 900 | 0.05 | 1 | E | E | E | E |
| Example 17 | Al$_2$O$_3$—40%TiO$_2$ | 700 | 0.05 | 1 | E | E | E | E |
| Comparative example 1 | Resin film A | 25 | 0.1 | 20 | B | B | B | B |
| Comparative example 2 | Resin film B | 40 | 0.1 | 20 | B | B | B | B |
| Comparative example 3 | Ni | 300 | 0.05 | 20 | B | G | R | R |
| Comparative example 4 | DLC | 5000 | 0.01 | 1 | E | E | B | R |

TABLE 2

|  | Film | | | | Result of engine simulation test | | | |
|---|---|---|---|---|---|---|---|---|
|  |  |  |  |  | Piston ring | | Piston | |
|  | Material | Vickers hardness (HV) | Surface roughness Ra (μm) | Coating thickness (μm) | Film remaining amount | Aluminum cohesion resistant property | material Wear amount | Decision |
| Example 18 | SiC | 2800 | 0.01 | 1 | E | E | E | E |
| Example 19 | SiC | 2800 | 0.1 | 1 | E | E | E | E |
| Example 20 | SiC | 2800 | 0.2 | 1 | E | E | B | R |
| Example 21 | TiO$_2$ | 500 | 0.2 | 1 | G | E | E | E |
| Example 22 | TiO$_2$ | 500 | 0.3 | 1 | G | E | E | E |
| Example 23 | TiO$_2$ | 500 | 0.4 | 1 | G | E | B | R |

TABLE 3

|  | Film | | | | Result of engine simulation test | | | |
|---|---|---|---|---|---|---|---|---|
|  |  |  |  |  | Piston ring | | Piston | |
|  | Material | Vickers hardness (HV) | Surface roughness Ra (μm) | Coating thickness (μm) | Film remaining amount | Aluminum cohesion resistant property | material Wear amount | Decision |
| Example 24 | SiC | 2800 | 0.05 | 0.05 | B | G | R | R |
| Example 25 | SiC | 2800 | 0.05 | 0.1 | R | E | E | E |
| Example 26 | SiC | 2800 | 0.05 | 0.5 | G | E | E | E |
| Example 27 | SiC | 2800 | 0.05 | 1 | E | E | E | E |
| Example 28 | SiC | 2800 | 0.05 | 3 | E | E | E | E |
| Example 29 | TiO$_2$ | 500 | 0.05 | 0.5 | B | G | R | R |
| Example 30 | TiO$_2$ | 500 | 0.05 | 1 | G | E | E | E |
| Example 31 | TiO$_2$ | 500 | 0.05 | 2 | E | E | E | E |
| Example 32 | TiO$_2$ | 500 | 0.05 | 5 | E | E | E | E |
| Example 33 | TiO$_2$ | 500 | 0.05 | 10 | E | E | E | E |
| Example 34 | TiO$_2$ | 500 | 0.05 | 20 | E | E | E | E |

Figure 2:
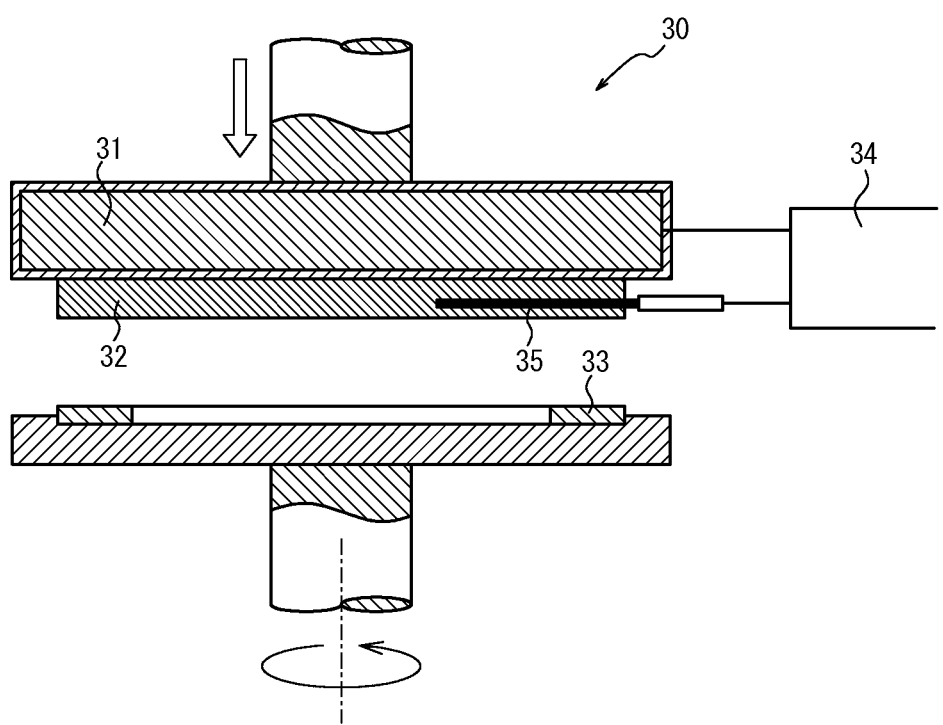
FIG. 2 is a schematic diagram of an engine simulation test equipment used in an embodiment.

The aluminum cohesion resistant property of each of the piston rings of Examples 1 to 34 and Comparative examples 1 to 4 was evaluated. For the evaluation, the engine simulation test apparatus illustrated in FIG. 2 was used. An engine simulation test apparatus 30 illustrated in FIG. 2 has a structure in which a piston 32 performs a reciprocating motion upward and downward and a piston ring 33 performs a revolving motion. The test was conducted by controlling the heating of the piston 32 by using a heater 31, a temperature controller 34, and a thermocouple 35. Test conditions include a surface pressure of 11 MPa, a ring revolving speed of 3 mm/s, controlled temperature at 265° C., and a test time of 5 hours, and the test was conducted while spraying a certain amount of oil together with nitrogen gas. Following the test, a remaining amount of the film on the piston ring and the occurrence of aluminum adhesion were examined. Results thus obtained are shown in Tables 1 to 3. Note that evaluation criteria of the remaining amount of the film are as follows:

E: 0.8 μm or more
G: 0.4 μm to 0.8 μm (exclusive of 0.8 μm)
R: 0 μm to 0.4 μm (exclusive of 0 μm and 0.4 μm)
B: no film remained Note that the aluminum cohesion resistant property was visually evaluated. Results thus obtained are shown in Tables 1 to 3. Evaluation criteria of the aluminum cohesion resistant property are as follows:

E: no aluminum cohesion occurred
G: very minor aluminum cohesion occurred
B: aluminum cohesion occurred The wear amount of the piston material was obtained by measuring a shape of a surface of the piston material after the test and calculating a depth from a reference surface. Results thus obtained are shown in Tables 1 to 3. Evaluation criteria of the wear amount are as follows:

E: less than 1.0 μm
G: 1.0 μm to 2.0 μm (exclusive of 2.0 μm)
R: 2.0 μm to 3.0 μm (exclusive of 3.0 μm)
B: 3.0 μm or more From the results of the evaluation of the aluminum cohesion resistant property of the piston ring and the wear amount of the piston material, properties of the piston rings were comprehensively evaluated. Results thus obtained are shown in Tables 1 to 3. Evaluation criteria of the wear amount are as follows:

E: Excellent
G: Good
R: Relatively good
B: Bad

Here, in the comprehensive evaluation, the property of the piston ring having a remained film, no aluminum cohesion, and the wear amount of the piston material less than 1.0 μm was evaluated as Excellent. The property of the piston ring having no remained film, aluminum cohesion, and the wear amount of the piston material 3.0 μm or more was evaluated as Bad. Otherwise, the property of the piston ring was evaluated either Good or Relatively good. The film with no item evaluated as Bad was evaluated as Good, while the film with 1 or 2 items evaluated as Bad was evaluated as Relatively good.

<Evaluation of Aluminum Cohesion Resistant Property>

As shown in Tables 1 to 3, the aluminum cohesion occurred on neither one of the piston rings of Examples 1 to 34. Although the films of the Examples 24 and 29 were thin and disappeared after the test and caused the aluminum cohesion, the aluminum cohesion was very minor and negligible and thus was regarded as no problem.

On the other hand, the piston rings of Comparative examples 1 and 2 had no remained film at all after the test and caused the aluminum cohesion. Although the piston ring of Comparative example 3, in a manner similar to those of Comparative examples 1 and 2, had no remained film at all after the test, the aluminum cohesion was very minor.

Further, the piston ring of Comparative example 4 had a large amount of remained film and thus no aluminum cohesion occurred.

<Evaluation of Wear Amount of Piston Material>

As shown in Tables 1 to 3, the wear amounts of the pistons of all Examples except Examples 20, 23, 24, and 29 were less than 1 μm. In Examples 20 and 23 where the films have relatively large surface roughness, the wear amounts were large, i.e., 3 μm or more. In Examples 24 and 29 where the films were relatively thin, the wear amounts were slightly large, i.e., 2 μm to 3 μm (exclusive of 3.0 μm).

On the other hand, the wear amounts in Comparative examples 1 and 2 were large. i.e., 3 μm or more. While the wear amount in Comparative example 3 was slightly large, the wear amount in Comparative example 4 was small.

Table 2 shows a relation between the surface roughness of the film and the wear amount of the piston material. As can be seen in Table 2, Examples 18, 19, 21, and 22 having the Vickers hardness and the surface roughness of the film satisfying the aforementioned formula (A) suppress the wear of the piston material while achieving high aluminum cohesion resistant property. Also, Examples 1 to 17 shown in Table 1 having the Vickers hardness and the surface roughness of the film satisfying the aforementioned formula (A) suppress the wear of the piston material while achieving high aluminum cohesion resistant property.

Further, Table 3 shows a relation between the thickness of the film and the wear amount of the piston material. As can be seen in Table 3, Examples 25 to 28 and 30 to 34 having the Vickers hardness and the thickness of the film satisfying the aforementioned formula (B) suppress the wear of the piston material while achieving high aluminum cohesion resistant property. Also, Examples 1 to 17 shown in Table 1 having the thickness of the film and the wear amount of the piston material satisfying the aforementioned formula (B) suppress the wear of the piston material while achieving high aluminum cohesion resistant property.

<Comprehensive Evaluation>

Examples 1 to 34 were all evaluated as "Excellent", "Good", or "Relatively good". In particular, when the Vickers hardness and the surface roughness of the aluminum cohesion resistant film satisfy the aforementioned formula (A), or when the Vickers hardness and the coating thickness satisfy the aforementioned formula (B), Examples were all evaluated as "Excellent". That is, it can be seen that piston rings capable of suppressing the wear of the piston material while achieving high aluminum cohesion resistant property were obtained.

On the other hand, Comparative examples 1 and 2 having the resin films had poor aluminum cohesion resistant property and large wear amounts of the piston material.

Further, Comparative example 3 having a nickel film and Comparative example 4 having a DLC film had either good or excellent aluminum cohesion resistant property and slightly large wear amounts of the piston material.

INDUSTRIAL APPLICABILITY

The present invention, by coating the aluminum cohesion resistant film made of ceramics on at least one of the upper side face and lower side face of the piston ring base material, may prevent the aluminum cohesion for a long time under the high temperature conditions, and thus is useful for an automobile parts manufacturing industry.

REFERENCE SIGNS LIST 1, 33 Piston ring
11 Piston ring base material
11a Upper side face of piston ring base material
11b Lower side face of piston ring base material
12 Aluminum cohesion resistant film
20, 32 Piston
21 Piston ring groove
22 Upper face of piston ring groove
23 Lower face of piston ring groove
24 Cylinder 30 Engine simulation test equipment
31 Heater
34 Temperature controller
35 Thermocouple

What is claimed is:

1. A piston ring for an internal combustion engine including a piston ring base material coated with an aluminum cohesion resistant film,
wherein
the aluminum cohesion resistant film consists of only ceramics coated on at least one of an upper side face or a lower side face of the piston ring base material, and
Vickers hardness HV of the aluminum cohesion resistant film and an arithmetic average roughness Ra (μm) of a surface of the aluminum cohesion resistant film satisfy the following formula (A):

$$Ra < -8.7 \times 10-5 HV + 0.39 \tag{A}$$

2. The piston ring for the internal combustion engine according to claim 1, wherein the Vickers hardness HV of the aluminum cohesion resistant film and thickness h (μm) of the aluminum cohesion resistant film satisfy the following formula (B):

$$h > -2.9 \times 10^{-4} HV + 0.89 \tag{B}$$

3. The piston ring for the internal combustion engine according to claim 1, wherein the Vickers hardness HV of the aluminum cohesion resistant film is 500 to 2800.

4. The piston ring for the internal combustion engine according to claim 1, wherein the arithmetic average roughness Ra (μm) of the surface of the aluminum cohesion resistant film is no more than 0.3 μm.

5. The piston ring for the internal combustion engine according to claim 1, wherein the thickness h (μm) of the aluminum cohesion resistant film is 0.1 μm to 20 μm.

6. The piston ring for the internal combustion engine according to claim 1, wherein the ceramics forming the aluminum cohesion resistant film is composed of at least one selected from a group including alumina, titania, yttria, zirconia, silica, magnesia, cbromia, silicon carbide, chromium carbide, aluminum nitride, titanium nitride, silicon nitride, and chromium nitride.

* * * * *